US010973150B2

(12) United States Patent
Huang et al.

(10) Patent No.: US 10,973,150 B2
(45) Date of Patent: Apr. 6, 2021

(54) HEAT DISSIPATION ASSEMBLY AND MAINBOARD MODULE

(71) Applicant: GIGA-BYTE TECHNOLOGY CO., LTD., New Taipei (TW)

(72) Inventors: Shun-Chih Huang, New Taipei (TW); Tai-Chuan Mao, New Taipei (TW); Yi-Jhen Lin, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 16/578,424

(22) Filed: Sep. 23, 2019

(65) Prior Publication Data

US 2020/0137925 A1    Apr. 30, 2020

(30) Foreign Application Priority Data

Oct. 24, 2018 (TW) .................................. 107137459

(51) Int. Cl.
*H05K 7/20* (2006.01)
*F28D 15/00* (2006.01)
(Continued)

(52) U.S. Cl.
CPC ......... *H05K 7/20272* (2013.01); *F28D 15/00* (2013.01); *F28F 3/12* (2013.01);
(Continued)

(58) Field of Classification Search
CPC ... H01L 23/473; H01L 23/427; H01L 23/467; F28F 3/12; F28F 2260/02; F28F 27/02;
(Continued)

(56) References Cited

U.S. PATENT DOCUMENTS 4,692,592 A * 9/1987 Kale ........................ F24H 1/202
392/450
5,985,483 A * 11/1999 Verhoog ............. H01M 2/1077
429/120
(Continued)

FOREIGN PATENT DOCUMENTS

TW              M568025        10/2018

OTHER PUBLICATIONS

"Search Report of Europe Counterpart Application", dated Mar. 19, 2020, p. 1-p. 7.

*Primary Examiner* — Adam B Dravininkas
(74) *Attorney, Agent, or Firm* — JCIPRNET

(57) ABSTRACT

A heat dissipation assembly includes a case and a partition structure. The case includes a cavity, a first water hole, and a second water hole, wherein the cavity includes a first region and a second region communicated with each other. The first water hole and the second water hole are communicated with the first region. The partition structure includes a separation wall and a separation layer connected to each other, wherein the separation wall is vertically disposed in the first region to separate a first flow path and a second flow path disposed in left and right portions in the first region. The separation layer is horizontally disposed in the second region to separate a third flow path and a fourth flow path disposed in upper and lower portions in the second region.

12 Claims, 6 Drawing Sheets

(51) Int. Cl.
  *G06F 1/20* (2006.01)
  *F28F 27/02* (2006.01)
  *F28F 3/12* (2006.01)
  *F28F 1/02* (2006.01)

(52) U.S. Cl.
  CPC ............... *F28F 27/02* (2013.01); *G06F 1/20* (2013.01); *F28F 1/022* (2013.01); *G06F 2200/201* (2013.01)

(58) Field of Classification Search
  CPC ...... F28F 1/022; F28F 15/00; H05K 7/20927; H05K 7/20254; H05K 7/20145; H05K 7/20218; H05K 1/0203; H05K 7/20272; G06F 1/20; G06F 2200/201
  See application file for complete search history.

(56) References Cited

U.S. PATENT DOCUMENTS

| | | | |
|---|---|---|---|
| 2004/0182548 A1* | 9/2004 | Lovette | H01L 23/473 165/103 |
| 2004/0206477 A1* | 10/2004 | Kenny | F28F 3/086 165/80.4 |
| 2006/0002088 A1* | 1/2006 | Bezama | F28F 3/04 361/702 |
| 2006/0264073 A1* | 11/2006 | Yang | H01L 23/473 439/72 |
| 2014/0284029 A1* | 9/2014 | Yoshida | F28F 13/06 165/104.31 |
| 2015/0060027 A1* | 3/2015 | Tawa | F28F 1/025 165/143 |
| 2016/0029514 A1* | 1/2016 | Alakoc | H05K 7/20645 165/80.4 |
| 2016/0126160 A1* | 5/2016 | Jeong | H01L 23/473 361/699 |
| 2016/0322279 A1* | 11/2016 | Schmit | H01L 23/145 |
| 2016/0366793 A1* | 12/2016 | Kikuchi | H05K 7/20781 |
| 2018/0142968 A1* | 5/2018 | Deguchi | F28F 13/12 |
| 2018/0352686 A1* | 12/2018 | Song | H05K 7/20927 |
| 2019/0093964 A1* | 3/2019 | Kikuchi | F28F 9/0204 |

* cited by examiner

HEAT DISSIPATION ASSEMBLY AND MAINBOARD MODULE

CROSS-REFERENCE TO RELATED APPLICATION

This application claims the priority benefit of Taiwan application serial no. 107137459, filed on Oct. 24, 2018. The entirety of the above-mentioned patent application is hereby incorporated by reference herein and made a part of this specification.

BACKGROUND OF THE INVENTION

Field of the Invention

The invention relates to a heat dissipation assembly, and more particularly, to a heat dissipation assembly applied to a mainboard module.

Description of Related Art

Today's computer gamers focus on good computer performance, and high-performance computer parts require higher power consumption. In a high-speed computing environment, the operating temperature of high power consuming computer parts is increased, thus affecting the operational fluency of the computer system. The current common method of heat dissipation is to use a water-cooled heat dissipation assembly. The heat dissipation assembly mainly absorbs the heat energy of the heat source (such as a central processor, or a display chip of a mainboard,), and then discharges the heat-absorbing liquid for heat exchange cooling, and dissipates heat via this cycle. Existing water-cooled heat dissipation assemblies are typically limited by the space constraints of the heat source and may only dissipate heat for a single heat source.

SUMMARY OF THE INVENTION

The invention provides a heat dissipation assembly that dissipates heat from a plurality of heat sources.

A heat dissipation assembly of the invention includes a case and a separation structure. The case includes a cavity, a first water hole, and a second water hole, wherein the cavity includes a first region and a second region communicated with each other. The first water hole and the second water hole are communicated with the first region of the cavity. The partition structure includes a separation wall and a separation layer connected to each other, wherein the separation wall is vertically disposed in the first region of the cavity to separate a first flow path and a second flow path disposed in the left and right portions in the first region. The separation layer is horizontally disposed in the second region of the cavity to separate a third flow path and a fourth flow path disposed in upper and lower portions of the second region, wherein the first flow path is communicated with the third flow path, the third flow path is communicated with the fourth flow path, and the fourth flow path is communicated with the second flow path.

In an embodiment of the invention, the separation wall is disposed in a portion of the first region. The first water hole is adjacent to the first flow path beside the separation wall. The second water hole is away from the separation wall.

In an embodiment of the invention, the third flow path is located below the fourth flow path in the second region.

In an embodiment of the invention, the third flow path is located above the fourth flow path in the second region.

In an embodiment of the invention, the first region and the second region of the case have a height difference.

In an embodiment of the invention, the partition structure further includes two baffles, wherein one of the baffles is located between the first flow path and the fourth flow path to block the first flow path and the fourth flow path, and the other baffle is located between the second flow path and the third flow path to block the second flow path and the third flow path.

A mainboard module of the invention includes a mainboard, a first heat source disposed on the mainboard, a second heat source disposed on the mainboard, and a heat dissipation assembly. The heat dissipation assembly includes a case and a partition structure. The case includes a cavity, a first water hole, and a second water hole, wherein the cavity includes a first region and a second region communicated with each other. The first water hole and the second water hole are communicated with the first region of the cavity. The case is disposed at the first heat source at a portion corresponding to the first region, and the case is disposed at the second heat source at a portion corresponding to the second region. The partition structure includes a separation wall and a separation layer connected to each other, wherein the separation wall is vertically disposed in the first region of the cavity to separate a first flow path and a second flow path disposed in left and right portions in the first region. The separation layer is horizontally disposed in the second region of the cavity to separate a third flow path and a fourth flow path disposed in upper and lower portions in the second region.

The first flow path is communicated with the third flow path, the third flow path is communicated with the fourth flow path, and the fourth flow path is communicated with the second flow path.

In an embodiment of the invention, the separation wall is disposed in a portion of the first region. The first water hole is adjacent to the first flow path and the first heat source beside the separation wall. The second water hole is away from the separation wall and the first heat source.

In an embodiment of the invention, the third flow path is located below the fourth flow path in the second region.

In an embodiment of the invention, the third flow path is located above the fourth flow path in the second region.

In an embodiment of the invention, the first region and the second region of the case have a height difference.

In an embodiment of the invention, the partition structure further includes two baffles, wherein one of the baffles is located between the first flow path and the fourth flow path to block the first flow path and the fourth flow path, and the other baffle is located between the second flow path and the third flow path to block the second flow path and the third flow path.

Based on the above, in the heat dissipation assembly in an embodiment of the invention, the space of the first region may be separated into the first flow path and the second flow path disposed in the left and right portions via the separation wall of the partition structure, and the space of the second region may be separated into the third flow path and the fourth flow path disposed in the upper and lower portions via the separation layer of the partition structure. Moreover, since the first flow path is communicated with the third flow path, the third flow path is communicated with the fourth flow path, and the fourth flow path is communicated with the second flow path, the cooling fluid may flow through the upper and lower flow paths (or lower and upper flow paths)

from one of the left and right flow paths and return to the other of the left and right flow paths when flowing through the second region from the first region and returning to the first region. The heat dissipation assembly in an embodiment of the invention is adapted to dissipate heat from two heat sources, wherein one of the heat sources is adapted to be disposed at a location corresponding to the first region on the case, and the other heat source is adapted to be disposed at a location corresponding to the second region on the case to allow the cooling fluid to dissipate heat from the two heat sources on the mainboard when flowing through the first region and the second region to improve the heat dissipation capability of the heat dissipation assembly to the electronic device.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
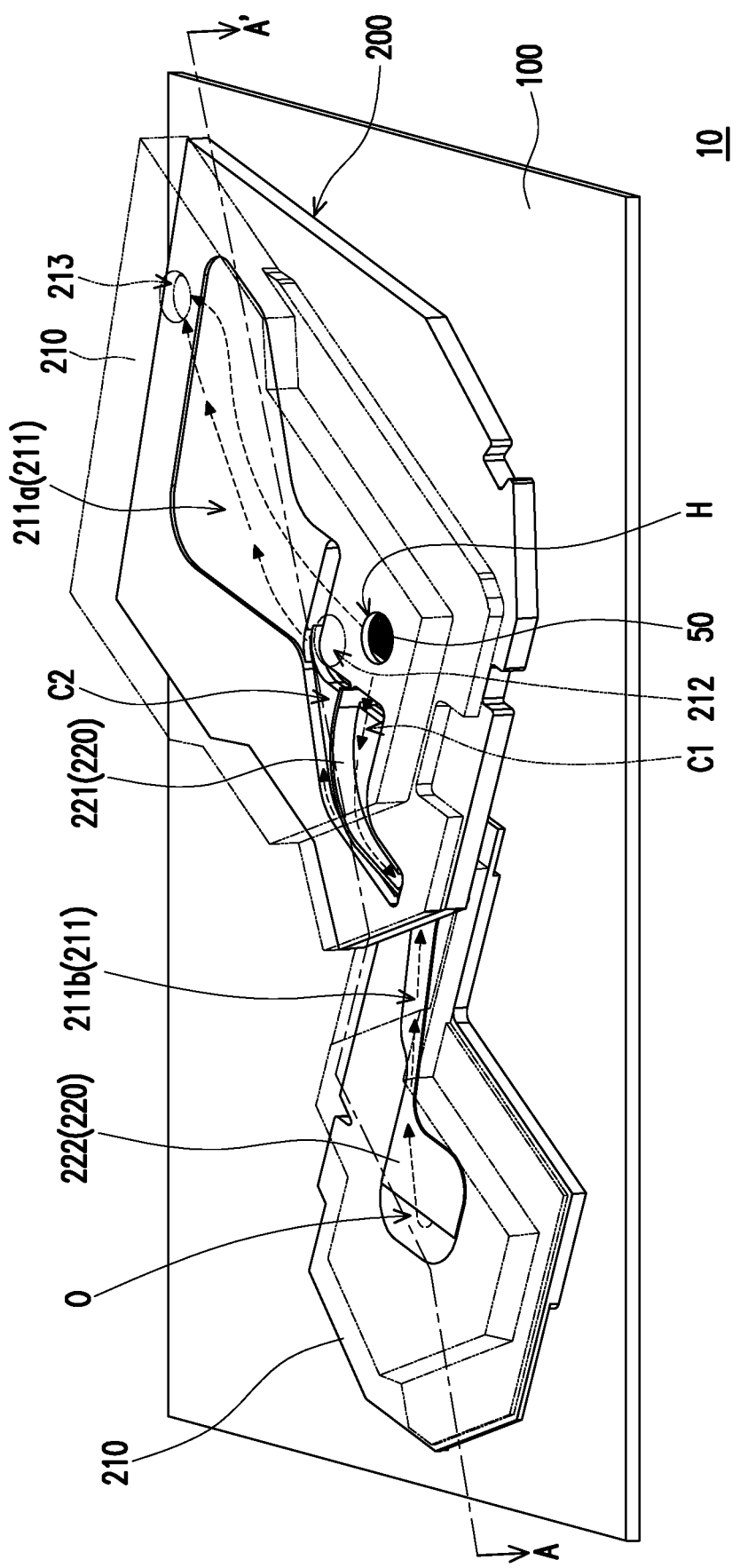
FIG. 1 is a perspective view of the exterior of a mainboard module of an embodiment of the invention.
Figure 2:
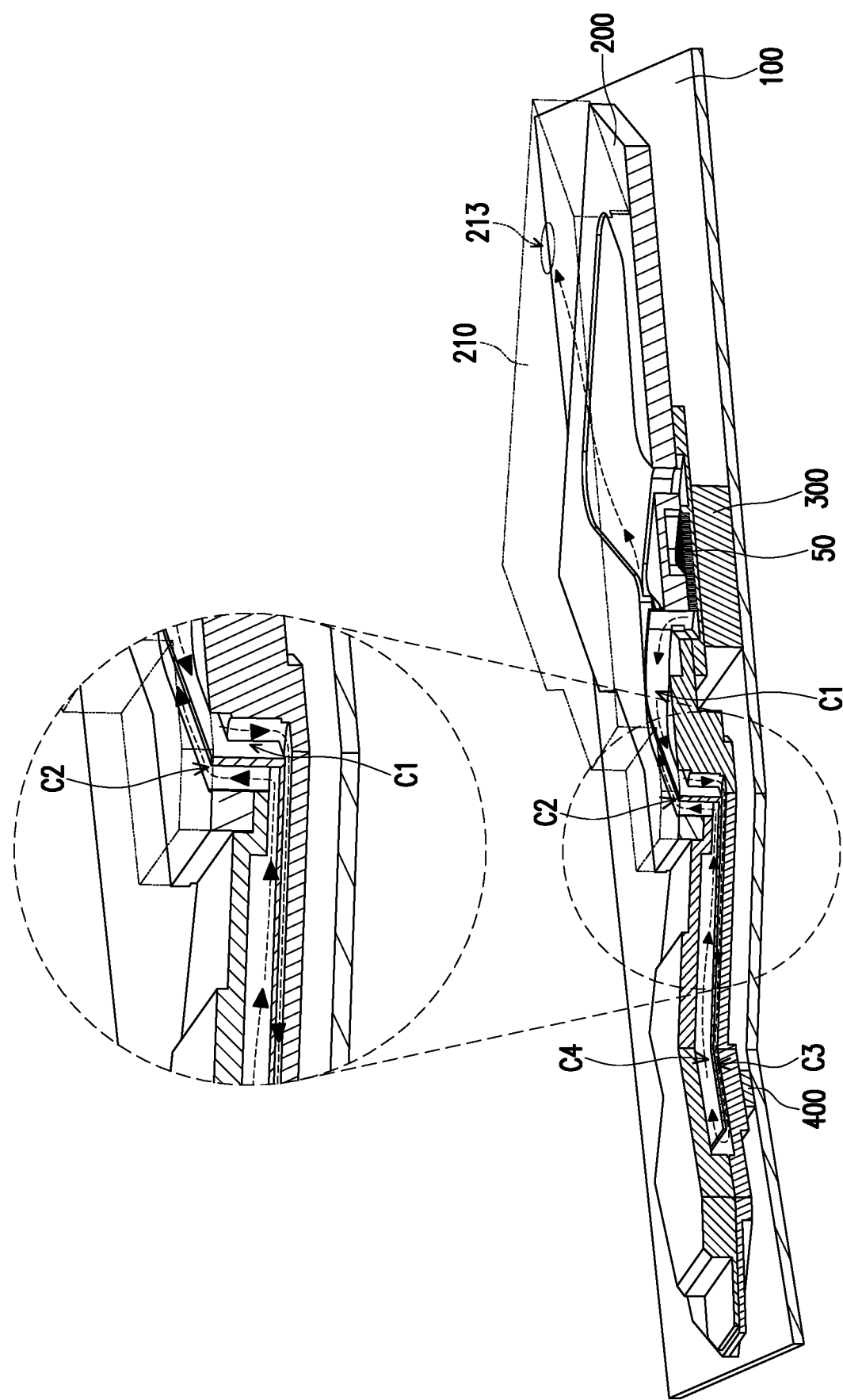
FIG. 2 is a cross-sectional view of the mainboard module of FIG. 1 along section line A-A'.
Figure 3:
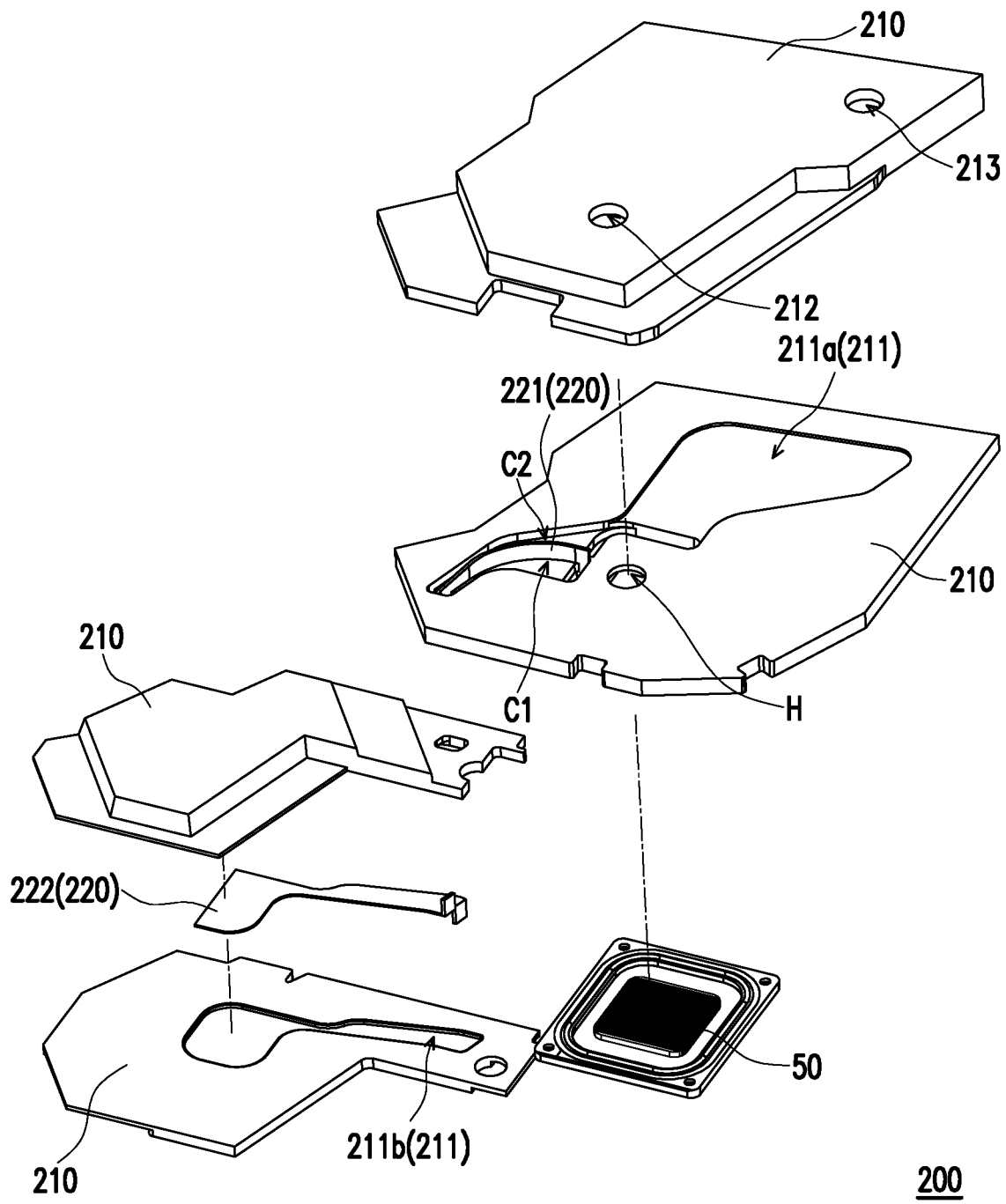
FIG. 3 is an exploded view of the heat dissipation assembly of FIG. 1.

FIG. 1 is a perspective view of the exterior of a mainboard module of an embodiment of the invention. FIG. 2 is a cross-sectional view of the mainboard module of FIG. 1 along section line A-A'. FIG. 3 is an exploded view of the heat dissipation assembly of FIG. 1. It is to be noted that a case 210 in FIG. 1 and FIG. 2 is shown by a broken line in order to clearly show the internal structure.

Referring to FIG. 1 to FIG. 3, an embodiment of the invention includes a mainboard module 10. The mainboard module 10 includes a mainboard 100, a heat dissipation assembly 200, a first heat source 300 (FIG. 2), and a second heat source 400 (FIG. 2). In the present embodiment, the first heat source 300 and the second heat source 400 are disposed on the mainboard 100, and the heat dissipation assembly 200 is adapted to be connected to the mainboard and dissipate heat from the first heat source 300 and the second heat source 400. In the present embodiment, the mainboard 100 may include a central processor (CPU) of a computer, a memory, a southbridge chip, a northbridge chip, and a graphics chip.

The heat dissipation assembly 200 is disposed on the mainboard 100. As shown in FIG. 3, the heat dissipation assembly 200 includes a case 210 and a partition structure 220. The case 210 includes a cavity 211, a first water hole 212, and a second water hole 213, wherein the cavity 211 includes a first region 211a and a second region 211b communicated with each other, and the first water hole 212 and the second water hole 213 are communicated with the first region 211a of the cavity 211. Due to the fluid pressure difference, a fluid is adapted to flow from the first water hole 212 or the second water hole 213 into the cavity 211, and the fluid flows out from the other water hole which has no fluid inflow so as to have less fluid pressure.

In addition, in the present embodiment, since there are many elements (not shown) on the mainboard 100, as may be seen from FIG. 3, the cavity 211 of the case 210 of the heat dissipation assembly 200 may correspondingly have a narrow or curved variation to give way to the elements on the mainboard 100. Of course, in other embodiments, the cavity 211 of the case 210 may also have the same width on different regions, and is not limited thereto.

As shown in FIG. 2, the case 210 is disposed at the first heat source 300 at a portion corresponding to the first region 211a (FIG. 3), and the case 210 is disposed at the second heat source 400 at a portion corresponding to the second region 211b (FIG. 3). In the present embodiment, the first heat source 300 is, for example, a central processor with higher computing efficiency, a northbridge chip, or an integrated chip of a northbridge chip and a central processor, and the second heat source 400 is, for example, a peripheral device interface, a multimedia controller, a communication interface, or a southbridge chip integrated from the above that performs low-speed signal processing. In addition, in the present embodiment, since the first heat source 300 is larger in size, in the cross-sectional view of FIG. 2, the first heat source 300 has a larger thickness than the second heat source 400 in the thickness direction of the heat dissipation assembly 200 and the mainboard 100. In some embodiments, the heat dissipation assembly 200 is attached to the mainboard 100 for enhancing the heat dissipation capability, so that there is a height difference between the first region 211a and the second region 211b of the cavity 211 in order for the case 210 of the heat dissipation assembly 200 to match the height of different positions on the mainboard 100.

In addition, in the present embodiment, since the heat generated by the first heat source 300 is larger, a fin 50 is disposed in a portion in the first region 211a of the cavity 211 corresponding to the first heat source 300 to enhance heat dissipation efficiency.

In the present embodiment, the heat dissipation assembly 200 has the partition structure 220 in order to enable the fluid to smoothly remove the heat of the first heat source 300 and the second heat source 400. The partition structure 220 includes a separation wall 221 and a separation layer 222 connected to each other, wherein the separation wall 221 is vertically disposed in the first region 211a of the cavity 211 to separate a first flow path C1 and a second flow path C2 disposed in the left and right portions in the first region 221a, and the separation layer 222 is horizontally disposed in the second region 211b of the cavity 211 to separate a third flow path C3 and a fourth flow path C4 disposed in the upper and lower portions in the second region 221b. The first flow path C1 is communicated with the third flow path C3, the third flow path C3 is communicated with the fourth flow path C4, and the fourth flow path C4 is communicated with the second flow path C2.

Referring to FIG. 1 to FIG. 3, in the present embodiment, the separation wall 221 is disposed in a portion of the first region 211a, and the separation wall 221 is extended from a side of the fin 50 upward to the top of the case 210 to absolutely separate the first flow path C1 and the second flow path C2 to prevent fluid from flowing toward the second region 211b from the first flow path C1 and the second flow path C2 simultaneously. In addition, in the present embodiment, the first water hole 212 is adjacent to the first flow path C1 and the first heat source 300 beside the separation wall 221, and the second water hole 213 is away from the separation wall 221 and the first heat source 300 to enhance flowing tendency of fluid. For example, a portion of the fluid flowing in from the first water hole 212 tends to flow into the second region 211b from the first flow path C1 due to being adjacent to the first flow path C1.

In addition to the clearly marked dashed arrows in FIG. 1 and FIG. 2, the unmarked dashed arrows may be considered as the flow direction of the fluid in the cavity 211. When the fluid flows in from the first water hole 212, the fluid flows into a hole H located above the fin 50 and comes in contact with the fin 50, and absorbs the heat of the first heat source 300 via the fin 50. Fluid injection pressure exists in the first water hole 212 used as the water inlet, but the fluid pressure in the second water hole 213 is less since the second water hole 213 is the water outlet. A portion of the fluid flows directly toward the second water hole 213 in the first region 211a after passing through the fin 50 and directly carries a portion of the heat to flow out of the case 210.

Another part of the fluid flows into the first flow path C1 due to being adjacent to the first flow path C1. It is to be noted that since the second flow path C2 is more adjacent to the second water hole 213 than the first flow path C1, the pressure of the second flow path C2 is less, and the first flow path C1 is adjacent to the first water hole 212, so that the pressure of the first flow path C1 is greater. Therefore, in the present embodiment, the fluid entering the first flow path C1 automatically flows to the second flow path C2 along the third flow path C3 and the fourth flow path C4 due to the pressure difference. That is, the fluid flowing into the first flow path C1 flows into the third flow path C3 of the second region 211b having less fluid pressure in the cavity 211 due to the influence of the pressure difference.

In the present embodiment, the third flow path C3 in the second region 211b is located below the fourth flow path C4 and adjacent to the second heat source 400. Therefore, the second heat source 400 in contact with the case 210 transfers heat to the fluid when the fluid flows through the third flow path C3 to achieve heat exchange of the heat generated by the second heat source 400 to the heat dissipation assembly 200 so as to dissipate heat from the second heat source 400.

Then, the fluid flows into the fourth flow path C4 via an opening O (FIG. 1) between the third flow path C3 and the fourth flow path C4. It should be noted that the opening O should not be too small to avoid the flow resistance of the fluid from being too large and interfering with fluid flow. Finally, the fluid flows into the second flow path C2 of the first region 211a communicated with the fourth flow path C4 and flows toward the second water hole 213 having less fluid pressure to carry another portion of the fluid out of the case 210. At this point, the fluid completes the flow path in the heat dissipation assembly 200 in the present embodiment.

It is worth mentioning that, although not specifically shown, the first water hole 212 and the second water hole 213 generally have tubes communicated with each other outside the case 210, and a condenser (not shown) and a pump (not shown) are installed to the tubes connected to the first water hole 212 and the second water hole 213 and outside the case 210. The fluid causes an increase in temperature when flowing through the first heat source 300 or the second heat source 400, and comes in contact with the condenser (not shown) after flowing out of the second water hole 213 to perform heat exchange to lower the fluid temperature, and the pressure of the fluid is increased by the pump (not shown) to pump the fluid into the first water hole 212. Via the above, the circulation of the fluid is achieved to dissipate heat from the mainboard 100.

Figure 4:
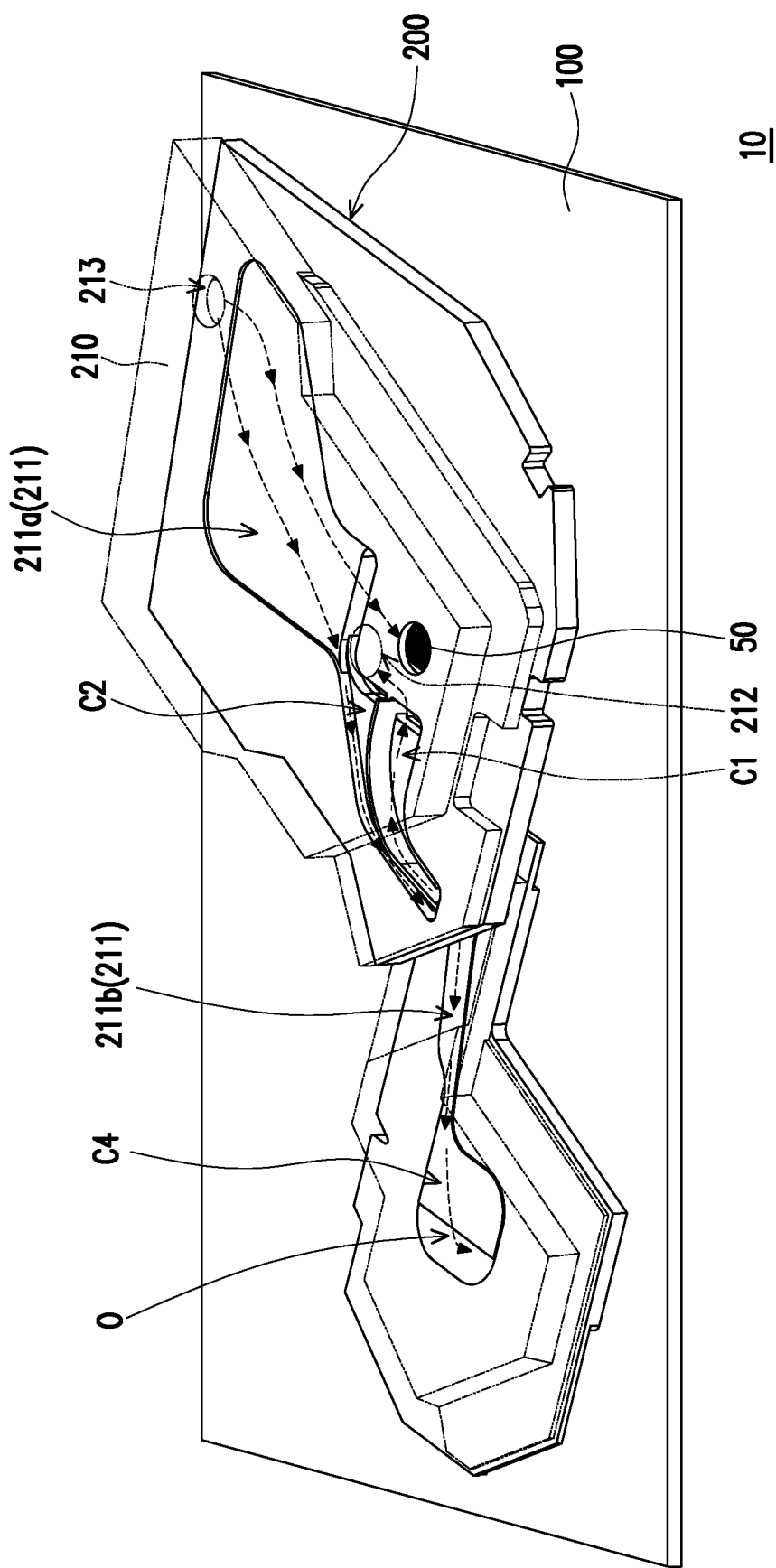
FIG. 4 is a schematic view of a fluid direction when a fluid in the heat dissipation assembly of FIG. 1 flows in from the second water hole and flows out of the first water hole.

Of course, the flow path of the fluid through the heat dissipation assembly 200 is not limited thereto. FIG. 4 is a schematic view of a fluid direction when a fluid in the heat dissipation assembly of FIG. 1 flows in from the second water hole and flows out of the first water hole. Referring to FIG. 4, in the present embodiment, the configuration between the remaining structures is not different except that the fluid flow direction is different from that of the embodiment of FIG. 1, and details are not repeated herein. In addition to the clearly marked dashed arrows in FIG. 4, the unmarked dashed arrows may be considered as the flow direction of the fluid in the cavity 211.

In FIG. 4, the fluid flows in from the second water hole 213, and a portion of the fluid flows toward the fin 50 below the first water hole 212 in the first region 211a and then directly flows toward the first water hole 212 having less fluid pressure than the second water hole 213 to firstly carry a portion of the heat absorbed by the fluid out of the case 210. Another portion of the fluid flows into the second flow path C2 that is more adjacent to the second water hole 213. It should be noted that, in the present embodiment, since the first flow path C1 is more adjacent to the first water hole 212 (water outlet hole) than the second flow path C2, the pressure of the first flow path C1 is less, and the second flow path C2 is adjacent to the second water hole 213 (water inlet hole), so that the pressure of the second flow path C2 is greater. Therefore, in the present embodiment, the fluid entering the second flow path C2 automatically flows to the first flow path C1 along the fourth flow path C4 and the third flow path C3 due to the pressure difference.

That is, the fluid entering the second flow path C2 flows into the fourth flow path C4 of the second region 211b having less fluid pressure in the cavity 211. Then, the fluid flows into the third flow path C3 located below the fourth flow path C4 via the opening O between the fourth flow path C4 and the third flow path C3. Finally, the fluid flows into the first flow path C1 of the first region 211a communicated with the third flow path C3 and flows toward the first water hole 212 having less fluid pressure to carry another portion of the fluid out of the case 210.

Figure 5:
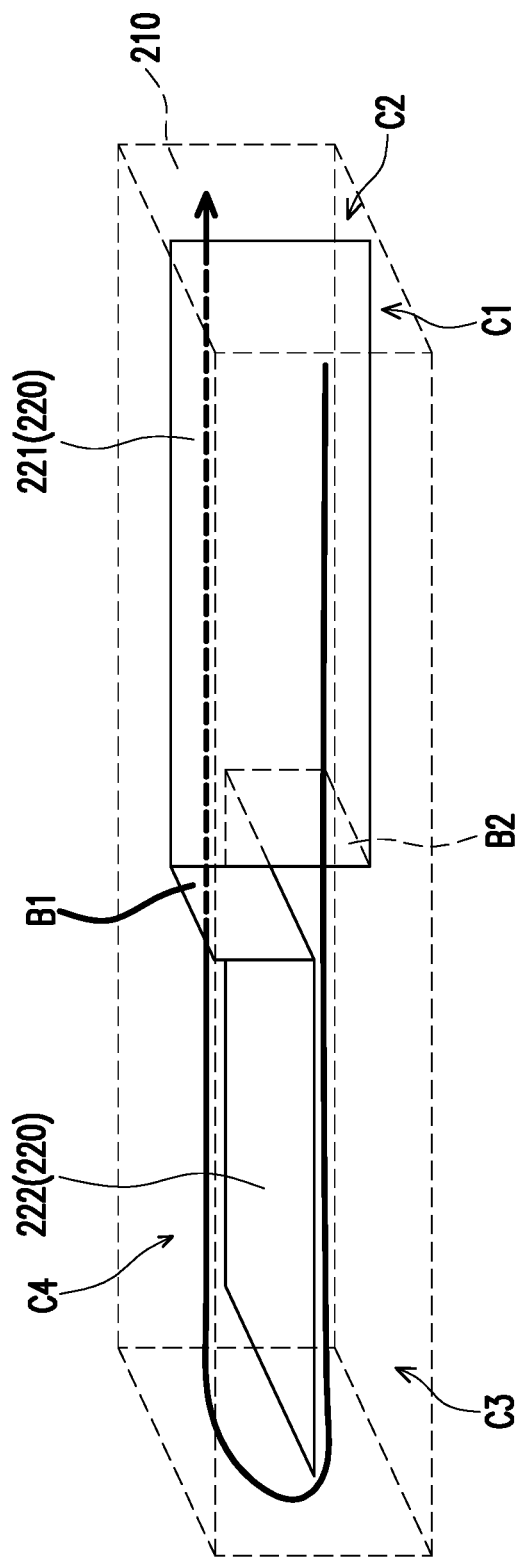
FIG. 5 is a schematic view of the arrangement relationship of the plurality of flow paths of FIG. 1 and FIG. 4.

It is worth mentioning that in the above embodiment, there is a height difference between the first region 211a and the second region 211b of the case 210, but the first region 211a and the second region 211b may also be located at the same height. FIG. 5 is a schematic view of the arrangement relationship of the plurality of flow paths of FIG. 1. Referring to FIG. 5, the partition structure 220 further includes a first baffle B1 and a second baffle B2. The first baffle B1 is located between the first flow path C1 and the fourth flow path C4 to block the first flow path C1 and the fourth flow path C4. The second baffle B2 is located between the second flow path C2 and the third flow path C3 to block the second flow path C2 and the third flow path C3. The first baffle B1 and the second baffle B2 are both respectively in contact with the separation wall 211 and the separation layer 222, and are connected to the case 210. The purpose is to prevent the fluid from flowing into the incorrect flow path in a plurality of flow paths. For example, the fluid flowing in from the first water hole 212 may only flow toward the direction of the third flow path C3 when flowing in from the first flow path C1 due to the blocking of the first baffle B1 and does not cross the separation layer 222 to directly flow toward the direction of the fourth flow path C4. In this way, the flowing direction of the fluid is ensured.

Figure 6:
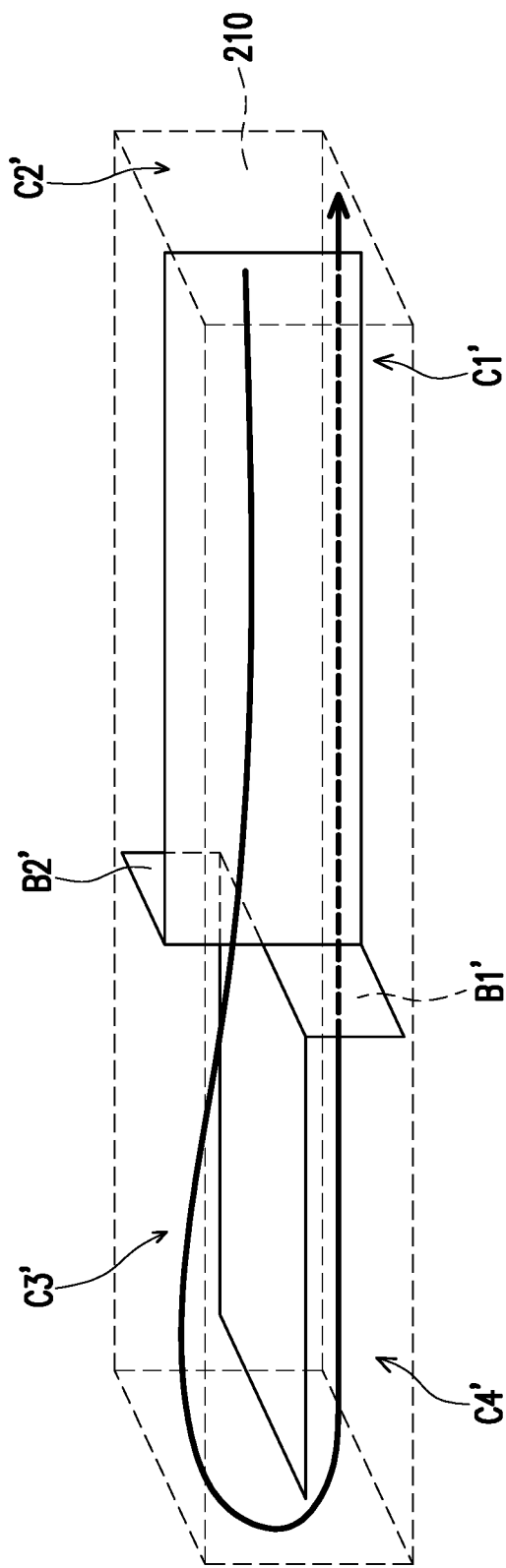
FIG. 6 is a schematic diagram of the arrangement relationship of a plurality of flow paths of another embodiment of the invention.

Of course, the configuration of the baffle is not limited thereto. FIG. 6 is a schematic diagram of the arrangement relationship of a plurality of flow paths of another embodiment of the invention. The difference from FIG. 5 is that the arrangement positions of the two baffles of FIG. 6 are different, and the arrangements of the remaining elements are all the same as those of FIG. 5 and are not repeated herein. Referring to FIG. 6, in the present embodiment, a third flow path C3' is defined to be located above a fourth flow path C4'. A first baffle B1' is located between the first flow path C1' and the fourth flow path C4', and a second baffle B2' is located between the second flow path C2' and the third flow path C3'. This configuration limits the flow of the fluid. The fluid may only flow through the first flow path C1', the third flow path C3', the fourth flow path C4', and the second flow path C2' in the order indicated by the arrow. Of course, if the user adjusts the flow direction of the fluid, the fluid may also flow through the second flow path C2', the fourth flow path C4', the third flow path C3', and the first flow path C1' along the direction opposite to the arrow.

Based on the above, in the mainboard module of an embodiment of the invention, the liquid may enter and exit the heat dissipation assembly via the first water hole and the second water hole of the case, and the cavity is separated into a plurality of flow paths via the partition structure to determine the direction of fluid flow. In the heat dissipation assembly in an embodiment of the invention, the space of the first region may be separated into the first flow path and the second flow path disposed in the left and right portions via the separation wall of the partition structure, and the space of the second region may be separated into the third flow path and the fourth flow path disposed in the upper and lower portions via the separation layer of the partition structure. Moreover, since the first flow path is communicated with the third flow path, the third flow path is communicated with the fourth flow path, and the fourth flow path is communicated with the second flow path, the cooling fluid may flow through the upper and lower flow paths (or lower and upper flow paths) from one of the left and right flow paths and return to the other of the left and right flow paths when flowing through the second region from the first region and returning to the first region. The fluid has pressure differences at various portions in the heat dissipation assembly so that the liquid flows smoothly in the heat dissipation assembly, and the fluid flows through the heat sources on the mainboard to remove the heat generated by the heat sources.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A heat dissipation assembly, comprising:
   a case comprising a cavity, a first water hole, and a second water hole, wherein the cavity comprises a first region and a second region communicated with each other, and the first water hole and the second water hole are communicated with the first region of the cavity; and
   a partition structure comprising a separation wall and a separation layer connected to each other, wherein the separation wall is vertically disposed in the first region of the cavity to separate a first flow path and a second flow path disposed in left and right portions in the first region, and the separation layer is horizontally disposed in the second region of the cavity to separate a third flow path and a fourth flow path disposed in upper and lower portions in the second region, wherein the first flow path is communicated with the third flow path, the third flow path is communicated with the fourth flow path, and the fourth flow path is communicated with the second flow path,
   wherein a fluid sequentially flows from the first flow path which is one of the left and right portions of the first region separated by the separation wall into the third flow path which is one of the upper and lower portions of the second region separated by the separation layer, then flows into the fourth flow path which is the other one of the upper and lower portions of the second region separated by the separation layer, and then flows into the second flow path which is the other one of the left and right portions of the first region separated by the separation wall, or flows from the second flow path which is one of the left and right portions of the first region separated by the separation wall into the fourth flow path which is one of the upper and lower portions of the second region separated by the separation layer, then flows into third flow path which is the other one of the upper and lower portions of the second region separated by the separation layer, and then flows into the first flow path which is the other one of the left and right portions of the first region separated by the separation wall.

2. The heat dissipation assembly of claim 1, wherein the separation wall is disposed in a portion of the first region, the first water hole is adjacent to the first flow path beside the separation wall, and the second water hole is away from the separation wall.

3. The heat dissipation assembly of claim 1, wherein the third flow path is located below the fourth flow path in the second region.

4. The heat dissipation assembly of claim 1, wherein the third flow path is located above the fourth flow path in the second region.

5. The heat dissipation assembly of claim 1, wherein the first region and the second region of the case have a height difference.

6. The heat dissipation assembly of claim 1, wherein the partition structure further comprises two baffles, wherein one of the baffles is located between the first flow path and the fourth flow path to block the first flow path and the fourth flow path, and the other baffle is located between the second flow path and the third flow path to block the second flow path and the third flow path.

7. A mainboard module, comprising:
   a mainboard;
   a first heat source disposed on the mainboard;
   a second heat source disposed on the mainboard; and
   a heat dissipation assembly, comprising:
      a case comprising a cavity, a first water hole, and a second water hole, wherein the cavity comprises a first region and a second region communicated with each other, the first water hole and the second water hole are communicated with the first region of the cavity, the case is disposed at the first heat source at a portion corresponding to the first region, and the case is disposed at the second heat source at a portion corresponding to the second region; and a partition structure comprising a separation wall and a separation layer connected to each other, wherein the separation wall is vertically disposed in the first region of the cavity to separate a first flow path and a second flow path disposed in left and right portions in the first region, and the separation layer is horizontally disposed in the second region of the cavity to separate a third flow path and a fourth flow path disposed in upper and lower portions in the second region, wherein the first flow path is communicated with the third flow path, the third flow path is communicated with the fourth flow path, and the fourth flow path is communicated with the second flow path, wherein a fluid sequentially flows from the first flow path which is one of the left and right portions of the first region separated by the separation wall into the third flow path which is one of the upper and lower portions of the second region separated by the separation layer, then flows into the fourth flow path which is the other one of the upper and lower portions of the second region separated by the separation layer, and then flows into the second flow path which is the other one of the left and right portions of the first region separated by the separation wall, or flows from the second flow path which is one of the left and right portions of the first region separated by the separation wall into the fourth flow path which is one of the upper and lower portions of the second region separated by the separation layer, then flows into third flow path which is the other one of the upper and lower portions of the second region separated by the separation layer, and then flows into the first flow path which is the other one of the left and right portions of the first region separated by the separation wall.

8. The mainboard module of claim 7, wherein the separation wall is disposed in a portion of the first region, the first water hole is adjacent to the first flow path and the first heat source beside the separation wall, and the second water hole is away from the separation wall and the first heat source.

9. The mainboard module of claim 7, wherein the third flow path is located below the fourth flow path in the second region.

10. The mainboard module of claim 7, wherein the third flow path is located above the fourth flow path in the second region.

11. The mainboard module of claim 7, wherein the first region and the second region of the case have a height difference.

12. The mainboard module of claim 7, wherein the partition structure further comprises two baffles, wherein one of the baffles is located between the first flow path and the fourth flow path to block the first flow path and the fourth flow path, and the other baffle is located between the second flow path and the third flow path to block the second flow path and the third flow path.

* * * * *